(12) United States Patent
Frenzel et al.

(10) Patent No.: US 10,136,533 B2
(45) Date of Patent: Nov. 20, 2018

(54) METHOD OF PRODUCING A POTTED ELECTRONIC MODULE

(71) Applicants: Continental Teves AG & Co. oHG, Frankfurt (DE); Continental Automotive GmbH, Hannover (DE)

(72) Inventors: Henryk Frenzel, Regensburg (DE); Dietmar Huber, Roedermark (DE); Jakob Schillinger, Gaimersheim (DE); Joerg Moestl, Mainhausen (DE); Karl-Heinz Scherf, Eppstein (DE); Georg Weber, Egelsbach (DE)

(73) Assignees: Continental Teves AG & Co. oHG, Frankfurt (DE); Continental Automotive GmbH, Hannover (DE)

( * ) Notice: Subject to any disclaimer, the term of this patent is extended or adjusted under 35 U.S.C. 154(b) by 49 days.

(21) Appl. No.: 15/038,802

(22) PCT Filed: Feb. 18, 2015

(86) PCT No.: PCT/EP2015/053447
§ 371 (c)(1),
(2) Date: May 24, 2016

(87) PCT Pub. No.: WO2015/124647
PCT Pub. Date: Aug. 27, 2015

(65) Prior Publication Data
US 2017/0164493 A1 Jun. 8, 2017

(30) Foreign Application Priority Data
Feb. 18, 2014 (DE) ........................ 10 2014 202 978

(51) Int. Cl.
*H05K 3/30* (2006.01)
*H05K 5/02* (2006.01)
*H05K 13/00* (2006.01)

(52) U.S. Cl.
CPC ....... *H05K 5/0247* (2013.01); *H05K 13/0023* (2013.01); *Y10T 29/49146* (2015.01)

(58) Field of Classification Search
CPC .. H05K 5/0247; H05K 13/0023; H05K 1/141; H01R 13/5216; Y10T 29/4913; Y10T 29/49139; Y10T 29/49146
USPC ........... 29/830, 832, 837, 841; 174/528, 529
See application file for complete search history.

(56) References Cited

U.S. PATENT DOCUMENTS 4,546,412 A * 10/1985 Nakazawa ............. H05K 1/141
 174/529
7,002,807 B2 * 2/2006 Takabatake ........ H01R 13/5216
 174/528

(Continued)

FOREIGN PATENT DOCUMENTS

DE 102007034757 2/2008
DE 102011086048 10/2012

(Continued)

OTHER PUBLICATIONS

International Search Report of the International Searching Authority for International Application PCT/EP2015/053447, dated May 12, 2015, 3 pages, European Patent Office, HV Rijswijk, Netherlands.

(Continued)

*Primary Examiner* — Donghai D Nguyen
(74) *Attorney, Agent, or Firm* — W. F. Fasse

(57) ABSTRACT

A method is provided for producing an electronic module that includes an electronic assembly with a conductor which is arranged in a housing, and which includes an electrical contact guided out through the housing wall. In the method, a protective layer is removed from an area of the conductor by ablation, and then a potting or casting compound is introduced into the housing, so that the potting compound covers a location at which the electrical contact passes (Continued)

through the housing wall, and the potting compound adheres directly onto the exposed conductor at the area at which the protective layer was removed.

23 Claims, 2 Drawing Sheets

(56) References Cited

U.S. PATENT DOCUMENTS

| | | |
|---|---|---|
| 7,573,274 B2 | 8/2009 | Aratani |
| 2014/0027172 A1 | 1/2014 | Schillinger et al. |
| 2014/0347819 A1 | 11/2014 | Ott |
| 2015/0173227 A1 | 6/2015 | Ott et al. |

FOREIGN PATENT DOCUMENTS

| | | |
|---|---|---|
| DE | 102011089474 | 6/2013 |
| JP | 2002-280512 A | 9/2002 |
| WO | WO 2014/023457 | 2/2014 |

OTHER PUBLICATIONS

PCT International Preliminary Report on Patentability including English Translation of PCT Written Opinion of the International Searching Authority for International Application PCT/EP2015/053447, dated Aug. 23, 2016, 18 pages, International Bureau of WIPO, Geneva, Switzerland.

\* cited by examiner

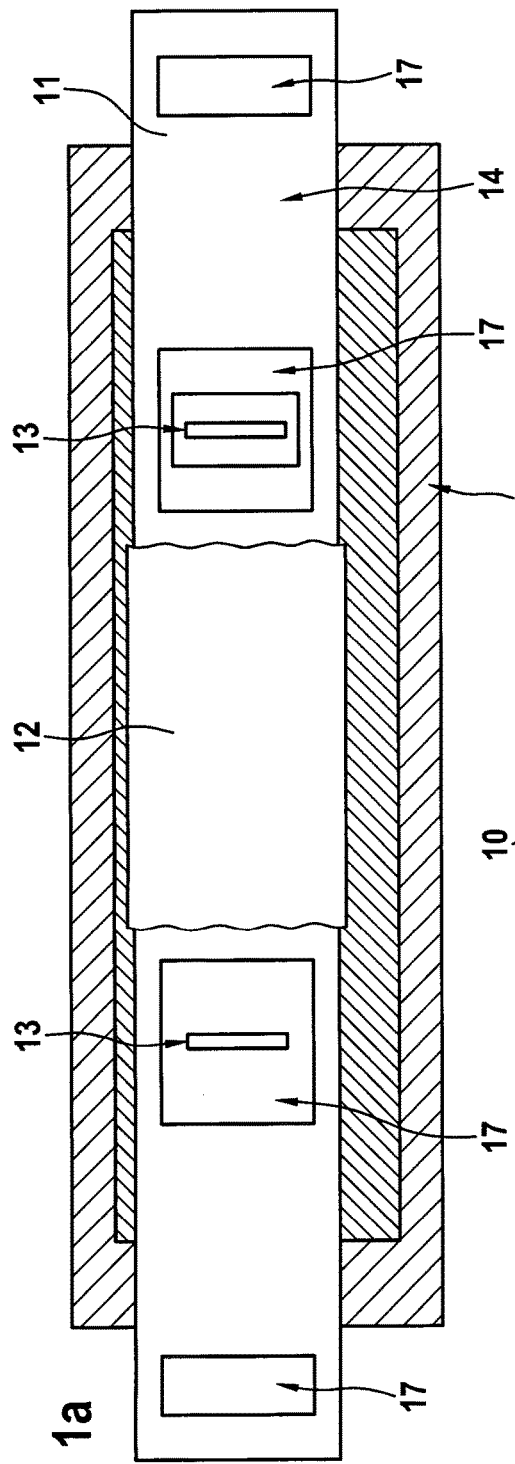
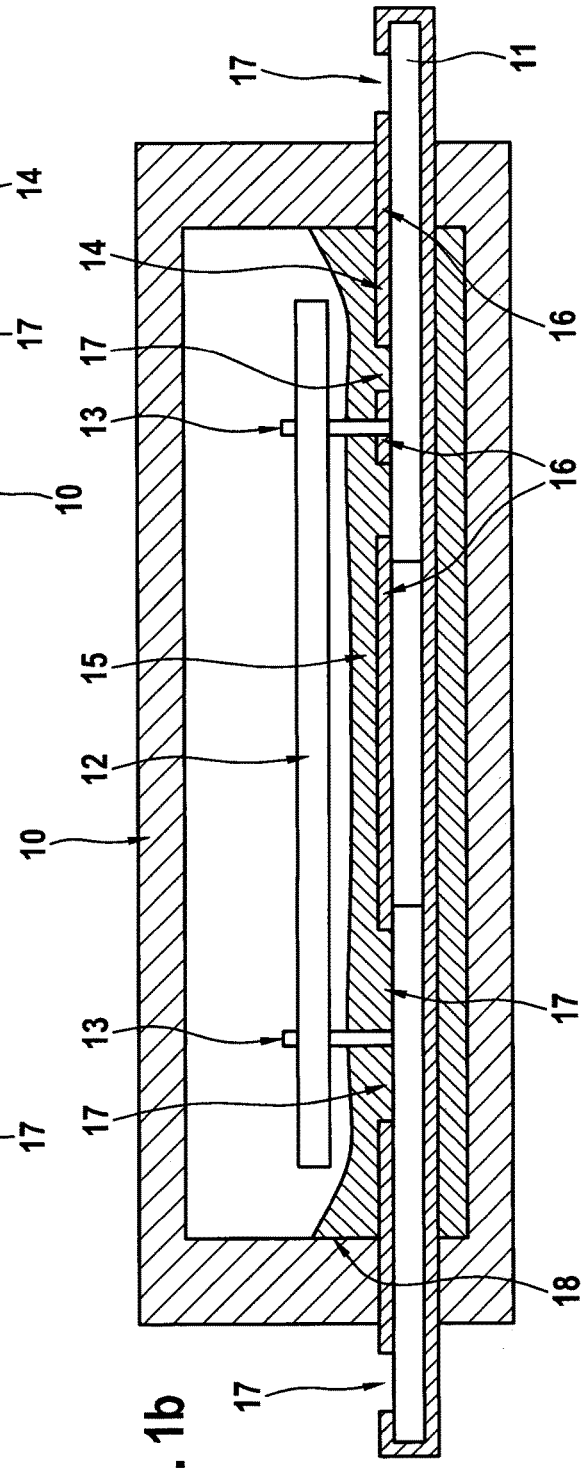

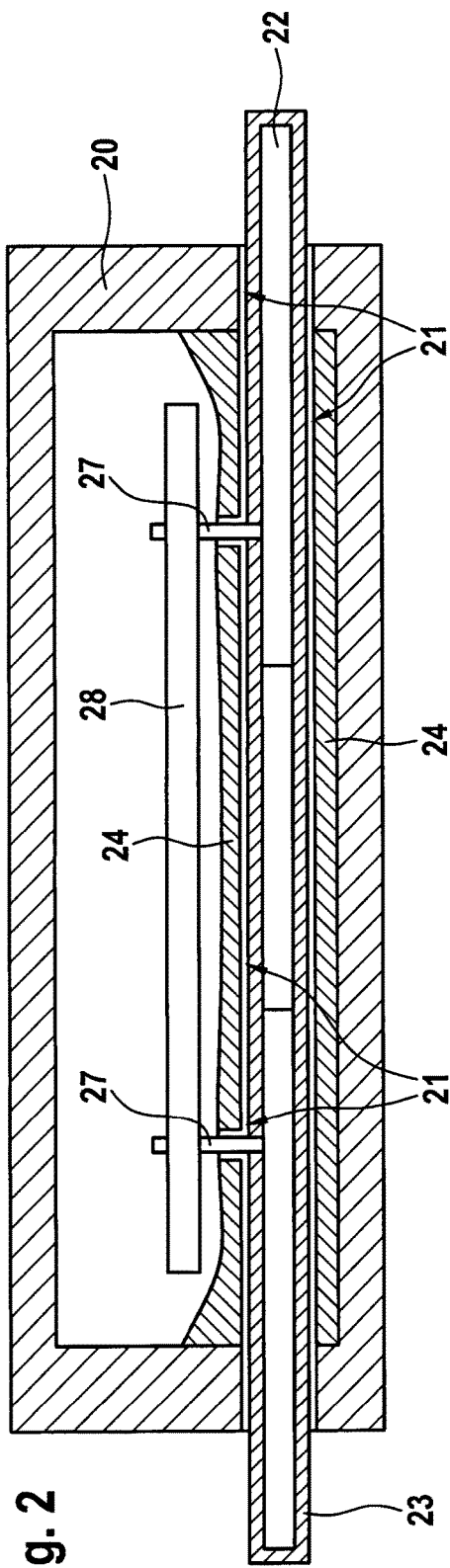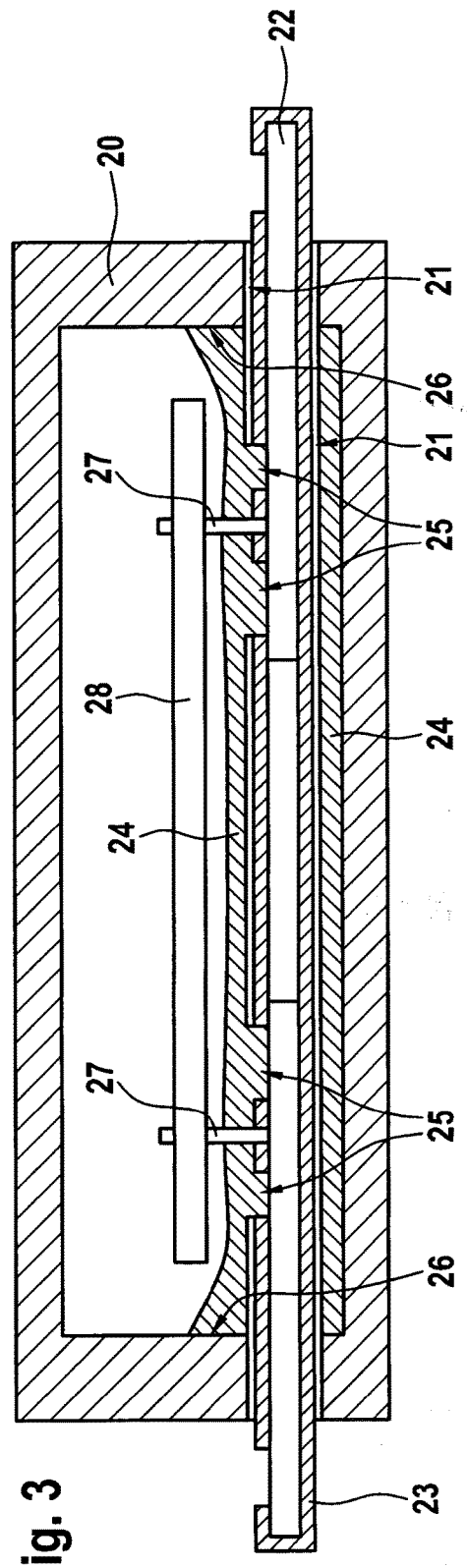

METHOD OF PRODUCING A POTTED ELECTRONIC MODULE

FIELD OF THE INVENTION

The invention relates to a method of producing an electronic module, and to an electronic module having features as result from being produced by such a method.

BACKGROUND INFORMATION

The prior art discloses surrounding electrical assemblies with a housing for the purpose of protecting against mechanical damage and also against environmental influences. It is likewise known to partially or completely fill the interior space in the housing in which the assembly is arranged with a casting compound in order to provide yet further protection. Finally, it is also known to surround the assembly, which can comprise an electrical conductor, for example a so-called shunt or a terminal of a plug, for example, with a protective layer, so that the assembly is even more effectively shielded against environmental influences. It is also often the case that only the conductor is surrounded by the protective layer. In this case, said protective layer serves to prevent oxidation or corrosion of the conductor surface and is furthermore necessary to prevent other negative effects which are known to a person skilled in the art in this connection.

Reliable connection of the casting compound to the housing, said connection providing reliable shielding against environmental influences and, respectively, being tight, is usually ensured. Owing to plasma activation of the housing, said plasma activation being known to a person skilled in the art, said connection can even be further improved for certain material combinations of the housing and the casting compound. A tight connection between the casting compound and different metals is likewise usually ensured.

However, one common problem which occurs in this connection is that the casting compound forms only inadequate connection with said protective layer, so that the connection between the conductor and the casting compound is broken in the event of changes in temperature or under the action of certain environmental media or environmental influences, this leading to the overall protective effect being adversely affected. By way of example, different types of contamination, for example water, can enter the housing through the gap which is produced between the protective layer and the casting compound and adversely affect the functioning of the assembly or destroy the assembly.

SUMMARY OF THE INVENTION

In view of the above, it is an object of an embodiment of the invention to avoid the disadvantages which arise in the prior art due to the comparatively poor connection between the casting compound (also called a potting compound) and the protective layer.

This object can be achieved in a method in an electronic module according to respective embodiments of the invention.

It is preferred to partially remove the protective layer and/or layer fully or partially from metallic points of the assembly or of the conductor or of the shunt before filling the housing with the casting compound. Since the metal beneath the protective layer is therefore exposed, the casting compound can form a reliable connection with the metal.

The term 'layer' is preferably understood to mean surface material of the conductor or shunt, wherein this surface material is, in particular, different from the main material of the conductor or shunt and therefore forms a protective layer or another additional, separate layer, or wherein said surface material is, in particular, the same material as or integral material with the conductor or shunt and it is only the surface material with a defined surface extent and defined thickness which is removed, for example by laser ablation.

By virtue of removing the layer and/or protective layer, the surface of the conductor or shunt which is exposed or locally exposed as a result is expediently activated or chemically activated or the roughness of said surface is increased. It is particularly preferred that the exposed surface of the conductor or shunt is oxidized, at least partially, by the removal of the layer and/or protective layer.

It is preferred that the layer, which is removed, of the at least one assembly is a protective layer.

It is preferred that the assembly comprises an electrical conductor, in particular in the form of a shunt, from which the layer is removed.

It is expedient that the electrical conductor, in particular in the form of a shunt, comprises the electrical contacts which are routed through the housing wall.

The layer or protective layer is preferably removed by means of ablation. In this case, the ablation is performed or carried out, in particular, by means of laser light and/or electrical energy, in particular electric current.

It is expedient that the ablation is performed as part of a joining process of the at least one assembly. In this case, the electrical conductor or shunt is, in particular, inserted into the housing or the housing is injection-molded and formed onto or around the shunt/conductor, wherein the electrical contacts of the conductor or shunt are routed through the housing wall, after which the ablation or removal of the layer is carried out at at least one point.

It is preferred that the layer or protective layer of the at least one assembly is removed from the conductor in the region of press-in pins which connect a conductor of the assembly to at least one assembly element, in particular in the respective region of a plurality of press-in pins.

It is expedient, in particular additionally, that the layer or protective layer of the at least one assembly is removed, in particular, from the conductor which comprises the electrical contacts, which are routed through the housing wall, in the region of said electrical contacts outside the housing.

Assembly elements or the electronics are preferably connected to the electrical conductor by means of press-in pins which are fastened on the conductor. Possible connection techniques include soldering, adhesive bonding, sintering, welding and other techniques which are known to a person skilled in the art in this connection.

The energy for welding the pins and/or for removing the layer or protective layer is preferably input either using laser light or using electric current.

The process of fastening the assembly elements or the electronics to the electrical conductor by means of the press-in pins is expediently used for the purpose of removing, for example by means of ablation, the protective layer in the region of the press-in pins by means of said input of energy using laser light or using electric current.

The layer or protective layer is preferably removed in such a way that a complete, closed surface is exposed without islands of protective layer remaining in the surface, or that a circumferential ring around one or more remaining islands of protective layer in the surface is exposed.

Therefore, only one single processing system (for example laser system or electricity system) or a single fixing process is necessary for connecting the casting compound to the assembly or to the conductor and for removing the protective layer.

The additional time required for removing the protective layer or for the ablation is negligibly low in this case.

The protective layer is preferably removed not only in the region of the press-in pins but, as an alternative or in addition, also in the region of an external contact-making zone or in the region of external plugs.

The electronic module is preferably developed such that the assembly comprises at least one electrical conductor and at least one assembly element, wherein the layer which is removed is removed from the conductor.

It is preferred that the layer, which is removed, of the at least one assembly is a protective layer.

It is expedient that the assembly element is an electronic circuit and/or an electronic arithmetic and logic unit.

It is preferred that the electrical conductor, in particular in the form of a shunt, comprises the electrical contacts which are routed through the housing wall.

The at least one assembly element and the at least one conductor are preferably electrically and mechanically connected to one another by means of press-in pins.

It is preferred that the casting compound covers the at least one conductor, at least within the housing.

It is expedient that the at least one assembly element is arranged in the housing outside the casting compound.

The electronic module is preferably designed such that the layer or protective layer of the at least one assembly is removed from the conductor in the region of the press-in pins.

It is preferred that the layer or protective layer of the at least one assembly is removed from the conductor in the region of the electrical contacts outside the housing.

The electronic module is preferably in the form of a battery sensor or in the form of part of a battery sensor, in particular for motor vehicles. To this end, said battery sensor expediently comprises a battery terminal for connection and for fastening to the pole of a vehicle battery.

BRIEF DESCRIPTION OF THE DRAWINGS

Further preferred features of embodiments of the invention can be found in the following description of exemplary embodiments with reference to the accompanying drawings in which FIG. 1a shows, schematically and by way of example, a sectional top view of an electronic assembly which is surrounded by a housing, FIG. 1b shows a sectional side view of the arrangement of FIG. 1a, FIG. 2 shows, schematically and by way of example, an electronic assembly which is surrounded by a housing and has diffusion channels for contamination, and FIG. 3 shows, schematically and by way of example, an electronic assembly which is surrounded by a housing and has diffusion channels which are interrupted according to the invention.

DETAILED DESCRIPTION OF EXAMPLE EMBODIMENTS OF THE INVENTION

FIG. 1 shows an electronic assembly which comprises conductor 11 and assembly element 12, and which is surrounded by housing 10. FIG. 1a shows an illustration from above, whereas FIG. 1b shows a side view. Conductor 11 and assembly element 12 are electrically and mechanically connected to one another by means of press-in connector pins 13. Conductor 11 is also surrounded or encased by protective layer 14 and encapsulated by potting or casting compound 15. Casting compound 15 covers conductor 11 in housing 10 in such a way that only press-in pins 13 project through and out of the casting compound 15. Casting compound 15 is connected to protective layer 14 at locations or areas 16, this however leading to an only weak and unreliable connection owing to the material properties of casting compound 15 and protective layer 14 according to the example. At locations or areas 17 however, protective layer 14 has been removed from conductor 11, so that the metallic material of conductor 11 is revealed or exposed at locations or areas 17. There is therefore a tight and reliable connection between casting compound 15 and conductor 11 at locations or areas 17 for example. A good and reliable connection is likewise produced at area 18, in this case between housing 10 and casting compound 15.

FIG. 2 shows an electronic assembly which is surrounded by housing 20 and, because it has not been produced according to the improved method of the present invention, has continuous diffusion channels 21 through which different types of contamination can enter housing 20 and can damage or destroy the assembly. Examples of contamination which can enter through diffusion channels 21 include water and salts. In this case, diffusion channels 21 are produced, for example, by conductor 22, which is surrounded by protective layer 23, not sealing tightly to housing 20 and furthermore protective layer 23 not sealing tightly to casting compound 24. Therefore, contamination can penetrate as far as press-in pins 27 and further along said press-in pins as far as assembly element 28 which can be damaged or destroyed by said contamination.

FIG. 3 shows an electronic assembly which is surrounded by housing 20 and has diffusion channels 21 which are interrupted according to the invention. Since conductor 22 does not have a protective layer 23 at locations or areas 25 (because the protective layer 23 has been removed at the areas 25 according to the invention), therefore a tight and reliable connection between conductor 22 and casting compound 24 is produced at areas 25 according to this example embodiment of the invention. Therefore, areas 25 form interruptions in diffusion channels 21 and prevent contamination, such as water or salts for example, from reaching press-in connector pins 27 and corroding said pins. There is a likewise tight and reliable connection between housing 20 and casting compound 24 at areas 26, so that no contamination can reach assembly element 28 here either.

The invention claimed is:

1. A method of producing an electronic module that includes a housing and an electronic assembly arranged at least partially within an interior space in the housing, wherein the electronic assembly includes an electronic component and an electrical conductor connected to the electronic component, wherein the electrical conductor comprises an electrical current shunt and two electrical contacts that are provided at two respective ends of the electrical current shunt and that respectively extend to outside of the housing through two passages provided in a housing wall of the housing, wherein the electrical conductor includes a conductor core and a protective layer on the conductor core, and wherein the method comprises the steps:

a) removing a portion of the protective layer from the conductor core at a removal area to expose a portion of a surface of the conductor core at an exposed area thereof; and b) after the step a), introducing a potting compound into the interior space in the housing sufficiently to cover the two passages through which the two electrical contacts pass through the housing wall, and to cover the exposed area of the surface of the conductor core, wherein the potting compound adheres directly onto the surface of the conductor core at the exposed area.

2. The method according to claim 1, further comprising processing the exposed area of the surface of the conductor core before the step b) to increase the adhesion of the potting compound onto the surface of the conductor core at the exposed area.

3. The method according to claim 2, wherein the processing comprises increasing the surface roughness of the exposed area of the surface of the conductor core.

4. The method according to claim 2, wherein the processing comprises chemically activating the exposed area of the surface of the conductor core.

5. The method according to claim 2, wherein the removing of the portion of the protective layer comprises ablation of the portion of the protective layer, and the ablation is continued to perform the processing which at least partially oxidizes the exposed area of the surface of the conductor core.

6. The method according to claim 1, wherein the removing of the portion of the protective layer is performed by an ablation process to ablate the portion of the protective layer and further to at least partially oxidize the exposed area of the conductor core.

7. The method according to claim 6, wherein the ablation process comprises laser light ablation.

8. The method according to claim 6, wherein the ablation process comprises electrical current ablation.

9. The method according to claim 6, further comprising connecting the electrical conductor to the electronic component by soldering, welding or sintering, wherein an energy source for the soldering, welding or sintering is also used for the ablation process.

10. The method according to claim 1, wherein the protective layer is an outer surface layer on the conductor core, and wherein the protective layer is made of a same material as, or an integral material with, the conductor core.

11. The method according to claim 1, wherein the protective layer is an additional layer applied on the conductor core, and wherein the protective layer is made of a protective material different from a conductor material of the conductor core.

12. The method according to claim 1, wherein the removal area at which the protective layer is removed from the conductor core is located where at least one of the two electrical contacts extends through a respective one of the passages provided in the housing wall.

13. The method according to claim 1, wherein the removal area at which the protective layer is removed from the conductor core is located on at least one of the two electrical contacts outside of the housing.

14. The method according to claim 1, wherein the potting compound is introduced into the interior space in the housing so that the potting compound covers the electrical conductor in the interior space, and so that the electronic component remains free and uncovered by the potting compound and exposed to a void in the interior space.

15. The method according to claim 1,
wherein the electronic assembly further includes an electrical connector pin that is electrically and mechanically connected directly to the conductor core and directly to the electronic component and provides an electrical connection between the conductor core and the electronic component, and
wherein the removal area at which the protective layer is removed from the conductor core is located and configured so that the potting compound adhered directly onto the surface of the conductor core at the exposed area interrupts and seals a diffusion channel that penetrates from outside of the housing into one of the passages, between the protective layer of the electrical conductor and the housing wall in the passage, and prevents the diffusion channel from progressing to the electrical connector pin where the electrical connector pin is connected directly to the conductor core.

16. A method of producing an electronic module that includes a housing and an electronic assembly arranged at least partially within an interior space in the housing, wherein the electronic assembly includes an electronic component, an electrical conductor, and an electrical connector pin that connects the electronic component to the electrical conductor, wherein the electrical conductor includes a conductor core and a protective layer on the conductor core, and wherein the method comprises the steps:

a) removing a portion of the protective layer from the conductor core at a removal area to expose a portion of a surface of the conductor core at an exposed area thereof;

b) electrically and mechanically connecting the electrical connector pin directly to the conductor core;

c) electrically and mechanically connecting the electronic component onto the electrical connector pin;

d) arranging the electrical conductor with a first portion thereof within the interior space in the housing and a second portion thereof extending to outside of the housing through a passage in a housing wall of the housing; and e) after the steps a), b) and c), introducing a potting compound into the interior space in the housing sufficiently to cover the passage through which the electrical conductor passes through the housing wall, and to cover the exposed area of the surface of the conductor core, wherein the potting compound adheres directly onto the surface of the conductor core at the exposed area;

wherein the exposed area of the surface of the conductor core is located either directly adjoining or adjacently spaced apart from the connector pin where the connector pin is connected directly to the conductor core.

17. The method according to claim 16, further comprising processing the exposed area of the surface of the conductor core before the step e) to increase the adhesion of the potting compound onto the surface of the conductor core at the exposed area.

18. The method according to claim 17, wherein:
the connecting of the electrical connector pin directly to the conductor core is performed by soldering, welding or sintering; and
a same energy is used to remove the portion of the protective layer, to process the exposed area of the surface of the conductor core, and to connect the electrical connector pin directly to the conductor core.

19. The method according to claim 18, wherein the protective layer is an additional layer applied on the conductor core, and wherein the protective layer is made of a protective material different from a conductor material of the conductor core.

20. The method according to claim 16, wherein:
the connecting of the electrical connector pin directly to the conductor core is performed by soldering, welding or sintering; and
a same energy is used to remove the portion of the protective layer, and to connect the electrical connector pin directly to the conductor core.

21. The method according to claim 16, wherein:
the exposed area of the surface of the conductor core is located directly adjoining the connector pin where the connector pin is connected directly to the conductor core;
the exposed area of the surface of the conductor core forms a continuous perimeter ring extending entirely, continuously and directly around a perimeter of the connector pin where the connector pin is connected directly to the conductor core; and
the potting compound adhering directly onto the surface of the conductor core at the exposed area forms a continuous perimeter seal extending entirely continuously around the connector pin where the connector pin is connected directly to the conductor core.

22. The method according to claim 16, wherein:
the exposed area of the surface of the conductor core is located adjacently spaced apart from the connector pin where the connector pin is connected directly to the conductor core;
an island of the protective layer remains around the connector pin where the connector pin is connected directly to the conductor core;
the exposed area of the surface of the conductor core forms a continuous perimeter ring extending entirely continuously around a perimeter of the island of the protective layer around the connector pin where the connector pin is connected directly to the conductor core; and
the potting compound adhering directly onto the surface of the conductor core at the exposed area forms a continuous perimeter seal around the island of the protective layer and the connector pin.

23. The method according to claim 16, wherein:
the conductor core of the electrical conductor has a flat rectangular parallelepiped shape;
the surface of the conductor core of which a portion is exposed at the exposed area is a flat planar surface;
the electrical connector pin extends perpendicularly from the flat planar surface of the conductor core; and
the exposed area of the surface of the conductor core is limited to the flat planar surface around the electrical connector pin, is bounded by a remainder of the protective layer around a continuous closed perimeter of the exposed area, and does not extend entirely around a cross-section of the conductor core.

* * * * *